United States Patent
Zanardi

(10) Patent No.: US 7,289,364 B2
(45) Date of Patent: Oct. 30, 2007

(54) PROGRAMMABLE MEMORY DEVICE WITH AN IMPROVED REDUNDANCY STRUCTURE

(75) Inventor: Stefano Zanardi, Seriate (IT)

(73) Assignees: STMicroelectronics S.r.l., Agrate Brianza (IT); Hynix Semiconductor Inc., Kyoungki-do (KR)

( * ) Notice: Subject to any disclaimer, the term of this patent is extended or adjusted under 35 U.S.C. 154(b) by 114 days.

(21) Appl. No.: 11/181,364

(22) Filed: Jul. 14, 2005

(65) Prior Publication Data

US 2006/0034137 A1    Feb. 16, 2006

(30) Foreign Application Priority Data

Jul. 14, 2004    (EP) .................................. 04103353

(51) Int. Cl.
   *G11C 16/06*    (2006.01)
(52) U.S. Cl. ..................... 365/185.09; 365/189.07; 365/200
(58) Field of Classification Search ............ 365/185.09
   See application file for complete search history.

(56) References Cited

U.S. PATENT DOCUMENTS

| 5,694,359 | A | * | 12/1997 | Park | 365/185.09 |
| 5,848,009 | A | * | 12/1998 | Lee et al. | 365/200 |
| 6,041,006 | A | * | 3/2000 | Tsuchiya | 365/210 |
| 6,154,389 | A | * | 11/2000 | Chung et al. | 365/185.09 |
| 6,301,152 | B1 | | 10/2001 | Campardo et al. | 365/185.09 |
| 6,418,051 | B2 | | 7/2002 | Manstretta et al. | 365/185.09 |
| 6,967,868 | B2 | * | 11/2005 | Kim et al. | 365/185.09 |
| 2002/0097618 | A1 | | 7/2002 | Ohno et al. | 365/201 |
| 2002/0185670 | A1 | | 12/2002 | Nakamura et al. | 257/298 |

FOREIGN PATENT DOCUMENTS

| EP | 1 357 559 A1 | 10/2003 |
| EP | 1 365 419 A1 | 11/2003 |

* cited by examiner

*Primary Examiner*—Son L. Mai
(74) *Attorney, Agent, or Firm*—Lisa K. Jorgenson; Robert Iannucci; Seed IP Law Group PLLC

(57) ABSTRACT

An electrically programmable memory device is proposed including: a matrix of memory cells arranged in a plurality of memory arrays and at least one redundancy array; and a substituting structure that substitutes the use of each memory array with the use of one of the at least one redundancy array in response to a failure of the memory array, wherein the memory arrays are grouped into at least one set. The substituting structure includes: a structure for associating each set with a predetermined one of the at least one redundancy array; a flag for each memory array indicative of the failure of the memory array; and a selecting for enabling each memory array or the associated redundancy array according to the corresponding flag.

22 Claims, 4 Drawing Sheets

PROGRAMMABLE MEMORY DEVICE WITH AN IMPROVED REDUNDANCY STRUCTURE

BACKGROUND OF THE INVENTION

1. Field of the Invention

The present invention generally relates to the field of solid-state memories, particularly to semiconductor memories and, even more particularly, to the field of non-volatile memories. Specifically, the invention relates to non-volatile memories that are electrically programmable.

2. Description of the Related Art

Non-volatile memory devices are commonly used in several applications when the data stored in the memory device need to be preserved even when the power supply is off. Within the class of non-volatile memory devices, electrically programmable (and erasable) memory devices, such as flash memories, have become very popular in applications in which the data to be stored is not immutable (as it might be the case of, e.g., a consolidated code for a microprocessor), being instead necessary from time to time to store new data, or to update the data already stored.

Typically, the memory device includes an arrangement of memory cells, disposed for example in rows and columns, so as to form a matrix integrated on a chip of semiconductor material together with read/program circuits and control circuits for managing read/write operations on the memory device.

Before shipping, each memory device undergoes a testing phase, particularly, a so-called Electrical-Wafer Sorting (EWS) in which some invalid memory cells, i.e., containing invalid data bits not repairable, can be found and identified. The presence of at least one inoperative memory cell is sufficient to put the whole memory device out of use.

In order to increase the yield of the manufacturing process, commonly spare memory cells are provided, designed to be used in substitution of invalid memory cells. These spare memory cells are defined as redundancy (or redundant) cells and are identical to the memory cells of the matrix. In particular, the layout of the memory cell matrix favors the use of entire rows or entire columns of redundancy cells (redundancy rows or columns) in place of rows or columns in which a memory cell has been found defective. A number of redundancy rows or columns is chosen on the basis of a compromise between the capability of correcting the failures and the area required for implementing not only the redundancy but also possible additional on-chip circuit for managing the redundancy.

In the solutions known in the art, an additional memory is provided for mapping the rows or columns including identified defective memory cells. Typically, the additional memory stores in a non-volatile way memory addresses (associative memory) corresponding to the faulty rows or columns. For example, the additional memory may be an Electrically Erasable Programmable ROM (EEPROM) Content Addressable Memory (CAM) or also an Unerassable Programmable ROM (UPROM). An additional register is provided for storing redundancy addresses of the redundancy rows or columns to be used in substitution of the faulty rows or columns. Before any operation on the memory device the memory addresses are compared with the content of the additional memory and, if found therein, they are discarded and substituted with the associated redundancy addresses stored in the register.

One of the main disadvantages of such solutions is a penalization on the access time of a memory location, depending on the time required to carry out the comparison between received memory addresses and all the faulty memory addresses stored in the additional memory. Accordingly, the access time increases with the size of the memory device.

Many solutions are known in the art, in which the additional memory is integrated on the same chip of the memory device together with a circuitry adapted to manage the redundancy in order to render the access to the memory device completely transparent to the final user. For example, reference can be made to U.S. Pat. No. 6,301,152 B1, U.S. Pat. No. 6,418,051 B2, EP 1 357 559 A1 and EP 1 365 419 A1 of STMicroelectronics Srl, in which efforts are made also to improve the access time.

Such a choice is very advantageous, but every increase of the corrective capability of the redundancy provokes an increase of the required area for its control circuitry, as well as an increase of the whole device complexity.

BRIEF SUMMARY OF THE INVENTION

One embodiment of the present invention proposes a solution, which is based on the provision of a flag for each row or column of the matrix indicative of a failure thereof.

Particularly, one embodiment of the present invention provides an electrically programmable memory device including: a matrix of memory cells arranged in a plurality of memory arrays and at least one redundancy array; and means for substituting the use of each memory array with the use of one of the at least one redundancy array in response to a failure of the memory array, wherein the memory arrays are grouped into at least one set, the means for substituting including: means for associating each set with a predetermined one of the at least one redundancy array; a flag for each memory array indicative of the failure of the memory array; and selecting means for enabling each memory array or the associated redundancy array according to the corresponding flag.

Advantageously, the matrix has a NAND architecture with a plurality of strings of memory cells arranged in a plurality of rows and a plurality of columns, each array including at least one column.

Preferably, the matrix includes a further row of strings of memory cells for storing the flags.

In an embodiment of the invention each array includes a plurality of columns, and the memory device further includes a selector for selecting a column in each array; the selector is interposed between the plurality of rows and the further row.

A suggested choice for implementing the further row is to connect in parallel the strings included in the same array.

Advantageously, the memory device includes for each array a read/program unit for reading or programming a selected memory cell of the array.

In an embodiment of the present invention the read/program unit includes a storage element for latching the flag read from the corresponding array.

Preferably, a multiplexer for each memory array is connected to an operative terminal of the read/program unit for the memory array and to an operative terminal of the read/program unit for the associated redundancy array. The multiplexer is controlled by the flag latched in the storage element.

Advantageously, the arrays are ordered in a sequence and the memory arrays of each set are not adjacent; the sets are organized into at least one group consisting of a plurality of sets and the redundancy arrays associated with the sets of the group are adjacent to the group.

A further embodiment of the invention provides a corresponding method of operating the electrically programmable memory device.

One embodiment of the present invention provides a memory device exploiting the redundancy of columns or rows, in which any comparison between a received memory address and a faulty memory address does not have to be carried out. Thus, the access time to a memory location and, thus, the performance of the memory device is improved. In addition, being the columns (or rows) of memory cells grouped into a number of sets each one associated with a predetermined redundancy column (or row), the managing of the redundancy is very simple, depending only on a logic value taken by a flag. Furthermore, with such a simple solution the waste of occupied area in a chip is greatly reduced.

BRIEF DESCRIPTION OF THE SEVERAL VIEWS OF THE DRAWING(S)

Further features and advantages of the present invention will be made apparent by the following description of a preferred embodiment thereof, provided merely by way of non-limitative example, description that will be conducted making reference to the attached figures, in which.

DETAILED DESCRIPTION OF THE INVENTION

Figure 1:
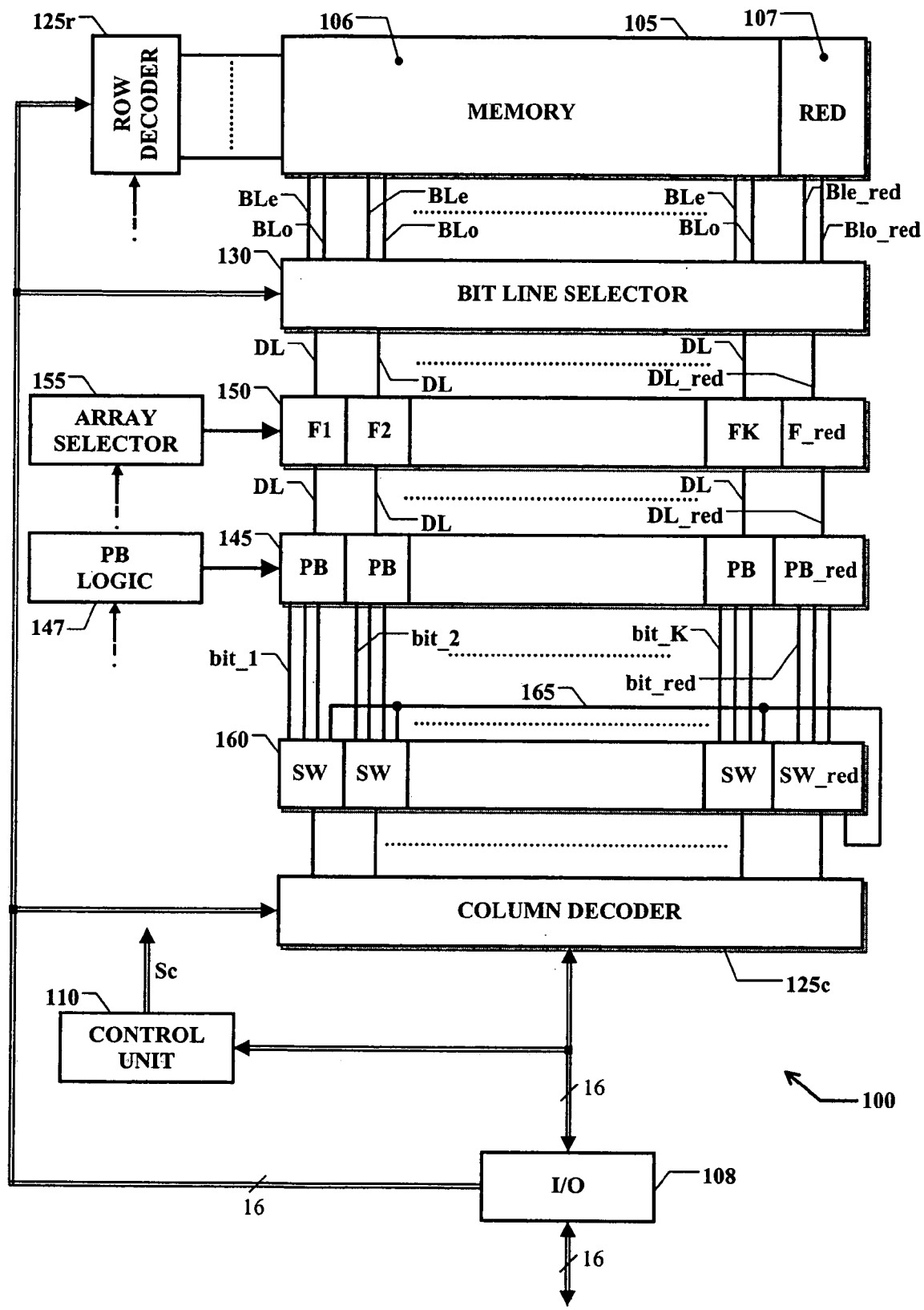
FIG. 1 is a schematic block diagram of a NAND memory according to an embodiment of the present invention.

With reference to the drawings, FIG. 1 is a schematic block diagram of a memory device 100 according to an embodiment of the present invention, particularly an electrically-programmable, non-volatile memory, such as a flash memory. The flash memory 100 is integrated in a chip of semiconductor material and includes a matrix 105 of memory cells having a so-called NAND architecture (described in greater detail in the following).

The matrix of memory cells is logically partitioned into a memory portion 106 and a redundancy portion 107. The memory portion 106 includes a number Mc of columns of memory cells for storing data bits. The redundancy portion 107 includes a number Mr of redundancy columns of memory cells (hereinafter referred to as redundancy cells) for storing data bits in place of the memory cells of the memory portion 106 that are defective.

Each column of memory cells in even position is controlled by a corresponding bit line BLe, and each column of memory cells in odd position is controlled by a corresponding bit line BLo. Similarly, each column of redundancy cells in even position is controlled by a corresponding redundancy bit line Ble_red, and each column of redundancy cells in odd position is controlled by a corresponding redundancy bit line Blo_red (only one pair of redundancy bit lines Ble_red and Blo_red is shown in the drawing). Each row of memory cells and redundancy cells is controlled by a corresponding word line WL.

The flash memory 100 interfaces with the outside world through a number p of I/O terminals coupled to respective I/O buffers, globally referred to as I/O interface 108; typically, the flash memory 100 is provided with eight or sixteen I/O terminals.

Through the I/O interface 108 the flash memory 100 receives from the outside, for example, memory addresses for selecting a desired location of the matrix 105 and data to be written in the addressed location of the matrix 105. Furthermore, through the I/O interface 108 the flash memory 100 outputs, for example, data read from the addressed location of the matrix 105.

The flash memory 100 includes a control unit 110, which manages the operation of the flash memory 100 and which, particularly, is capable of managing the timing of the flash memory 100. The control unit 110 provides control signals, globally referred to as Sc, to the other functional blocks of the flash memory 100; particularly, the control signals Sc are adapted to indicate which operation has to be performed (for example, a read or a write operation).

A word line decoder 125r receives and decodes a respective portion of the memory address and accordingly biases the associated word lines WL (and further auxiliary lines as it will be described in the following) to appropriate voltages, depending on the operation to be performed. Similarly, a bit line selector 130 receives a respective portion of the memory address and selects a packet of the bit lines BLe, BLo, BLe_red and BLo_red by biasing them to appropriate voltages. By selecting the packet of the bit lines BLe, BLe_red in even position, or the packet of the bit lines BLo, BLo_red in odd position, and a word line WL, a memory page of the matrix 105 is accessed.

Particularly, the bit line selector 130 selectively connects one of a bit line BLe in even position and, typically, an adjacent bit line BLo in odd position to a respective data line DL. Similarly, a redundancy bit line BLe_red and a redundancy bit line BLo_red are connectable through the bit line selector 130 to a respective data line DL_red. The data lines DL and the redundancy data lines DL_red are in turn connected to a page buffer 145 adapted to read/write a data word (consisting of, e.g., 512 Bytes) from/into a selected memory page of the matrix 105.

In this way, the bit lines BLe, BLo, and then the columns of the memory portion 106 of the matrix 105, are arranged in a plurality of memory pairs, each memory pair being connectable to a respective data line DL. Analogously, the redundancy bit lines BLe_red, BLo_red, and then the redundancy columns, are arranged in a plurality of redundancy pairs, each redundancy pair being connectable to a respective redundancy data line DL_red. Furthermore, according to an embodiment of the present invention, the pairs of columns of memory cells, and then the pairs of bit lines BLe, BLo, are grouped into a plurality of sets, each set being associated with a respective, predetermined redundancy pair. Particularly, each set includes a number K of pairs of columns in the memory portion 106, where K is equal to the ratio between the number Mc of columns in the memory portion 106 and the number Mr of redundancy columns.

The page buffer 145 is further adapted to latch the data word read or to be written during read/write operations on the matrix 105. Particularly, the page buffer 145 consists of a plurality of read/write units PB connected to respective data lines DL and a plurality of redundancy read/write units PB_red connected to respective redundancy data lines DL_red (only one shown in the drawing). The data lines DL and the redundancy data line DL_red transport respective data bits read from, or to be written into, the selected memory page by means of the page buffer 145. The operation of the page buffer 145 is generally managed by a page buffer logic control unit, schematized as a block identified as 147, receiving respective control signals from the control unit 110.

In addition, the flash memory 100, according to an embodiment of the present invention, includes a non-volatile redundancy memory register array 150 for storing information about defective columns of memory cells included in the memory portion 106 and about the redundancy columns included in the redundant portion 107 to be used in substitution.

In detail, the register array 150 stores in a non-volatile way K flag bits F1-FK for each set of memory pairs of bit lines BLe and BLo, each flag bit F1-FK corresponding to a respective memory pair of the set. For simplicity of illustration, in FIG. 1 the register array 150 is shown storing the K flag bits F1-FK of only one memory set. A flag bit F1-FK takes a low logic value '0', when at least one of the bit lines BLe and BLo of the corresponding pair is defective; in the opposite case, the flag bit F1-FK takes a high logic value '1'.

The register array 150 also stores a redundancy flag bit F_red for each redundancy pair of redundancy bit lines BLe_red and BLo_red (only one shown in the drawing). If a pair of redundancy bit lines BLe_red and BLo_red is already used in substitution of an associated defective memory pair of bit lines BLe and BLo, the redundancy flag bit F_red takes the low logic value '0'. If the pair of redundancy bit lines BLe_red and BLo_red is not used, the redundancy flag bit F_red takes the high logic value '1'. It has to be observed that, if the redundancy flag bit F_red takes the low logic value '0', then one of the flag bits F1-FK in turn is at the low logic value '0'.

The register array 150 is located between the bit line selector 130 and the page buffer 145 and comprises an arrangement of a plurality of flash memory cells having a NAND architecture (as it will be described in greater detail in the following). The register array 150 may exploit as bit lines the data lines DL and the redundancy data line DL_red. Being the page buffer 145 connected to the data lines DL and to the redundancy data line DL_red, it can be exploited for reading/writing also the register array 150; particularly, the page buffer 145 is adapted to read the whole content of the register array 150 at a time. The register array 150 is selected to be read (or, possibly, programmed) by means of an array selector 155, receiving corresponding control signals from the control unit 110.

Preferably, the register array 150 is not included in the matrix 105, being separated by the bit line selector 130. In this way, during a write or an erase operation on the matrix 105, the memory cells of the register array 150 do not undergo related stresses, accordingly ensuring a greater reliability.

The flash memory 100 further includes a bidirectional M/R multiplexer 160 (M/R mux 160) connected to the page buffer 145. Similarly to the page buffer 145, the M/R mux 160 consists of a plurality of switching units SW plus a plurality of redundancy switching units SW_red.

Each switching unit SW of the M/R mux 160 receives from (or provides to) a respective read/write unit PB of the page buffer 145 a respective data bit read from (or to be written into) a selected memory cell of a given set of K memory pairs. In FIG. 1 K switching units, corresponding to respective flag bits F1-FK, are shown receiving (or providing) respective data bits bit_1-bit_K. In the same way, each redundancy switching unit SW_red (only one shown in the drawing) receives from (or provides to) the read/write unit PB_red of the page buffer 145 a redundancy data bit bit_red read from (or to be written into) a selected redundancy cell of the associated redundancy pair.

A respective redundancy line 165 is connected between each one of K switching units SW and the associated redundancy switching unit SW_red of the M/R mux 160. A further redundancy line is connected between other K switching units SW and the respective associated redundancy switching unit SW_red, and so on.

Depending on the operation performed on the flash memory 100, the redundancy line 165 provides the redundancy data bit bit_red read from the selected redundancy cell to each one of the switching units SW, or it provides a data bit bit_k, to be written into a selected memory cell connected to a failed bit line BLe and BLo, to the redundancy switching unit SW_red.

The page buffer 145, exploited also for reading the flag bits F1-FK and F_red stored into the register array 150, provides selection signals indicative of the failure of the corresponding pair of bit lines BLe and BLo to each switching unit SW of the M/R mux 160. Accordingly, in a read operation the switching unit SW provides the redundancy bit in place of the data bit read from a failed memory cell. In a write operation the switching unit SW provides the data bit to be written into a failed memory cell to the redundancy switching unit SW_red.

Furthermore, a column decoder 125c is connected to the M/R mux 160 and, according to the decoding of a received portion of the memory address, enables connections between the I/O interface 108 of the flash memory 100 and a corresponding, selectable portion of the M/R mux 160. Considering that the I/O interface 108 includes p I/O terminals, the column decoder 125c can enable the connections with p switching units SW, SW_red at a time.

In this way, the column decoder 125c is exploited for fitting an internal data parallelism of the flash memory 100 (the page buffer 145 having a storage capability of, for example, 512 Bytes) with an external data parallelism.

Figure 2:
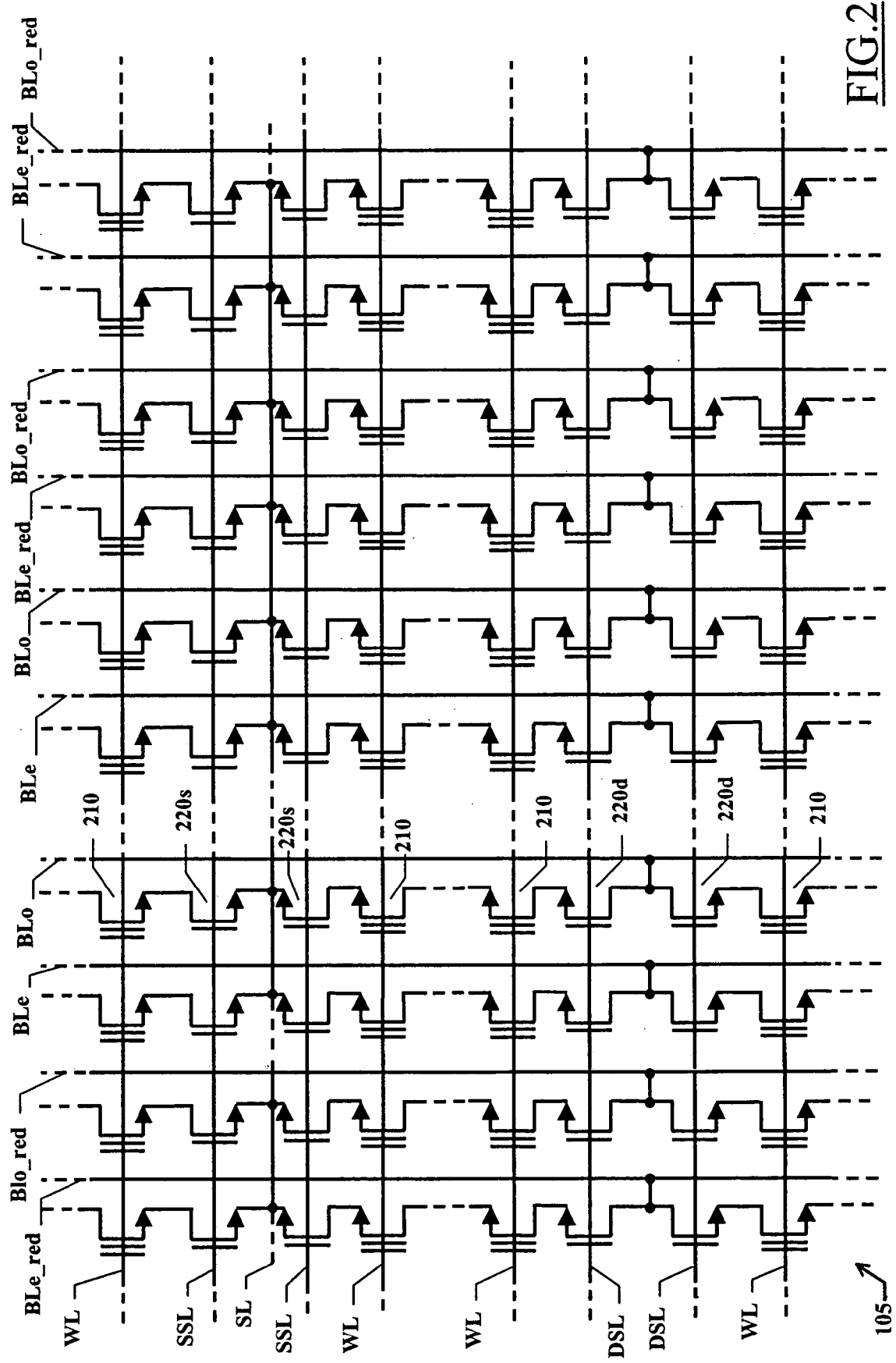
FIG. 2 shows in detail the NAND architecture of an arrangement of a plurality of flash memory cells included in the NAND memory of FIG. 1.

The NAND architecture of the matrix 105 is described with reference to FIG. 2.

Typically, each memory cell 210 consists of an N-channel MOS transistor having a charge-storage element, such as a conductive floating gate adapted to be charged by injected electrons. Without entering into excessive details, well known to those skilled in the art, in an erased condition (associated by convention with a logic value '1'), the memory cell 210 has a low threshold voltage value. The memory cell 210 is programmed by injecting electric charges into its floating gate: in the programmed condition (associated by convention with a logic value '0'), the memory cell 210 has a high threshold voltage value. Therefore, when a selected memory cell 210 is biased for reading its content, the memory cell 210 will be conductive if erased or non-conductive if programmed.

The arrangement 105 of the plurality of memory cells 210 consists of a matrix having a plurality of columns (for example, 8192 columns) and a plurality of rows (for example, 2048 rows).

In the matrix 105, groups of, e.g., eight, sixteen or even more (e.g., thirty-two) memory cells 210 are connected in series to each other to form a respective memory cells string, and different memory cell strings belonging to a same matrix column are connected in parallel to each other to a same bit line BLe, BLo, BLe_red or BLo_red.

The memory cells 210 of a generic string are in particular connected in series between a source select N-channel MOS transistor 220s and a drain select N-channel MOS transistor 220d. A generic, intermediate memory cell 210 in the memory cells string has the drain terminal connected to the source terminal of an adjacent memory cell 210, and the source terminal connected to the drain terminal of another adjacent memory cell 210. One of the two end memory cells 210 located at the ends of the string has the drain terminal connected to the source terminal of the drain select transistor 220d; the drain terminal of the drain select transistor 220d is connected to the corresponding bit line BLe, BLo, BLe_red, BLo_red, as well as to the drain terminal of the corresponding drain select transistor 220d of an adjacent memory cells string. Likewise, the other end memory cell 210 of the string has the source terminal connected to the drain terminal of the source select transistor 220s; the source terminal of the source select transistor 220s is connected to the source terminal of the corresponding source select transistor 220s of another adjacent memory cells string.

The control gate terminals of the memory cells 210 in each row are connected to a corresponding word line WL. The gate terminals of the drain select transistors 220d belonging to a common row of the matrix 105 are all connected to a corresponding drain select line DSL; similarly, the gate terminals of the source select transistors 220s belonging to a common row are all connected to a corresponding source select line SSL. The drain terminals of the drain select transistors 220d belonging to a common column of the matrix 105 are connected to a corresponding bit line BLe, BLo, BLe_red or BLo_red. Conversely, the source terminals of all the source select transistors 220s in the matrix 105 are connected to a common source line SL (which is typically kept at a reference voltage, or ground).

The memory cells 210 belonging to the same row, and then connected to the same word line WL, are logically partitioned into memory pages. Assuming, merely by way of example that the matrix 105 includes 8192 bit lines BLe, BLo, BLe_red, BLo_red, two memory pages of 512 Bytes for each word line WL are defined, a first page consisting for example of the memory cells 210 in an even position connected to the bit lines BLe, BLe_red, and a second page consists of the memory cells 210 in an odd position connected to the bit lines BLo, BLo_red. Thus, if, still by way of example, the matrix 105 includes 2048 word lines WL, the flash memory 100 has a total of 4096 memory pages of 512 Bytes each.

Preferably, in order to cover a greater number of failures, the memory pairs of columns of a set are not adjacent to each other, being separated by a predetermined number (e.g., one) of pairs of columns of different sets. For example, the bit lines BLe and BLo of a first memory pair of a first set in respective positions J−1 and J in the matrix 105 and the bit lines BLe and BLo of a first memory pair of a second set in respective positions J+1 and J+2 are considered. Supposing that the bit line BLo of the first set in the odd position J and the bit line BLe of the second set in the even position J+1 have failed, it is possible to establish a new connection between the bit line BLe in the even position J−1 and the bit line BLo in the odd position J+2. In this way, a memory pair is recovered and assigned to one of the first and second pairs, and only one redundancy pair has to be exploited.

In addition, the memory pairs of two sets are, for example, alternate and forms a respective group of sets. The redundancy pairs associated with these sets are adjacent to the group (particularly one at the begin and one at the end of the group) in order to have the redundancy line coupled to each set of the same length.

Figure 3:
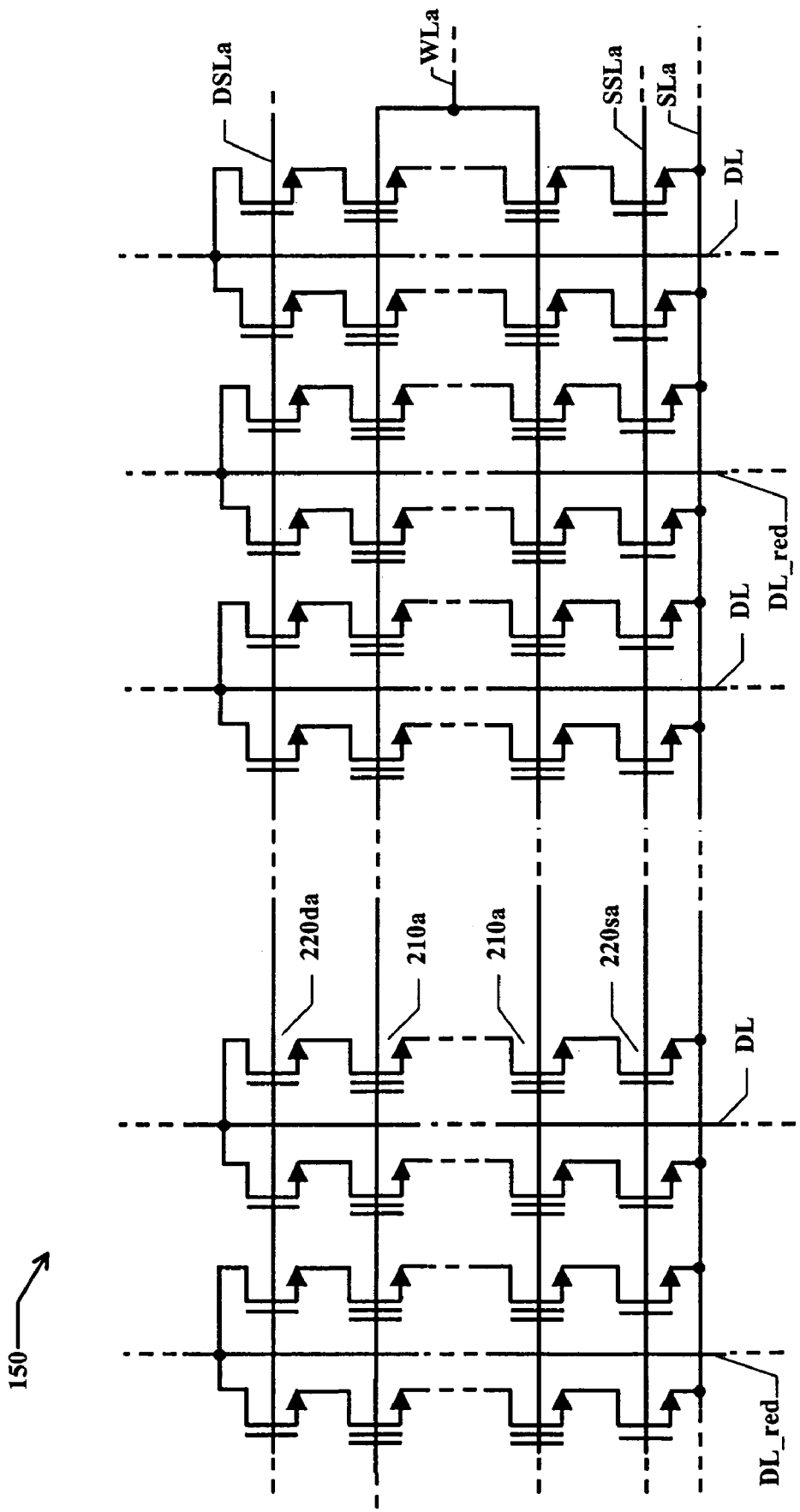
FIG. 3 shows a NAND array of a plurality of flash memory cells included in the NAND memory of FIG. 1, exploited for storing information about columns of memory cells of the NAND memory.

An exemplifying structure of the register array 150 is described with reference to FIG. 3. The architecture of the register array 150, comprising a plurality of flash memory cells 210a, is analogous to the architecture of the matrix described with reference to FIG. 2.

The register array 150 may comprise, for example, a single drain select line DSLa, a single source select line SSLa and a common source line SLa. A plurality of strings of memory cells 210a is connected between the drain select line DSLa and the source select line SSLa by means of respective drain select transistors 220da and source select transistors 220sa.

Each data line DL and each redundancy data line DL_red may be connected to two respective strings of memory cells 210a in parallel, each string comprising, e.g., sixteen memory cells 210a. In addition, each row of memory cells 210a is controlled preferably by a same word line WLa. Accordingly, a write operation on the register array 150 programs a same flag bit in the memory cells 210a of two strings at a time.

Such a structure advantageously permits to exploit the same process for fabricating, and the same circuitry for reading/writing, both the matrix 105 and the register array 150, thus saving the area occupied on the chip. However, it is not excluded that the register array 150 has a different architecture.

Furthermore, the described structure of the register array 150 with two selected strings of memory cells in parallel to the respective data line DL, DL_red brings to a better data retention and to a faster read operation with respect to a memory array having one selected memory cell for each data line.

Alternatively, only one row of memory cells 210a of the register array 150, with a respective word line, can be exploited, particularly selecting two memory cells for each data line DL, DL_red at the time.

Figure 4:
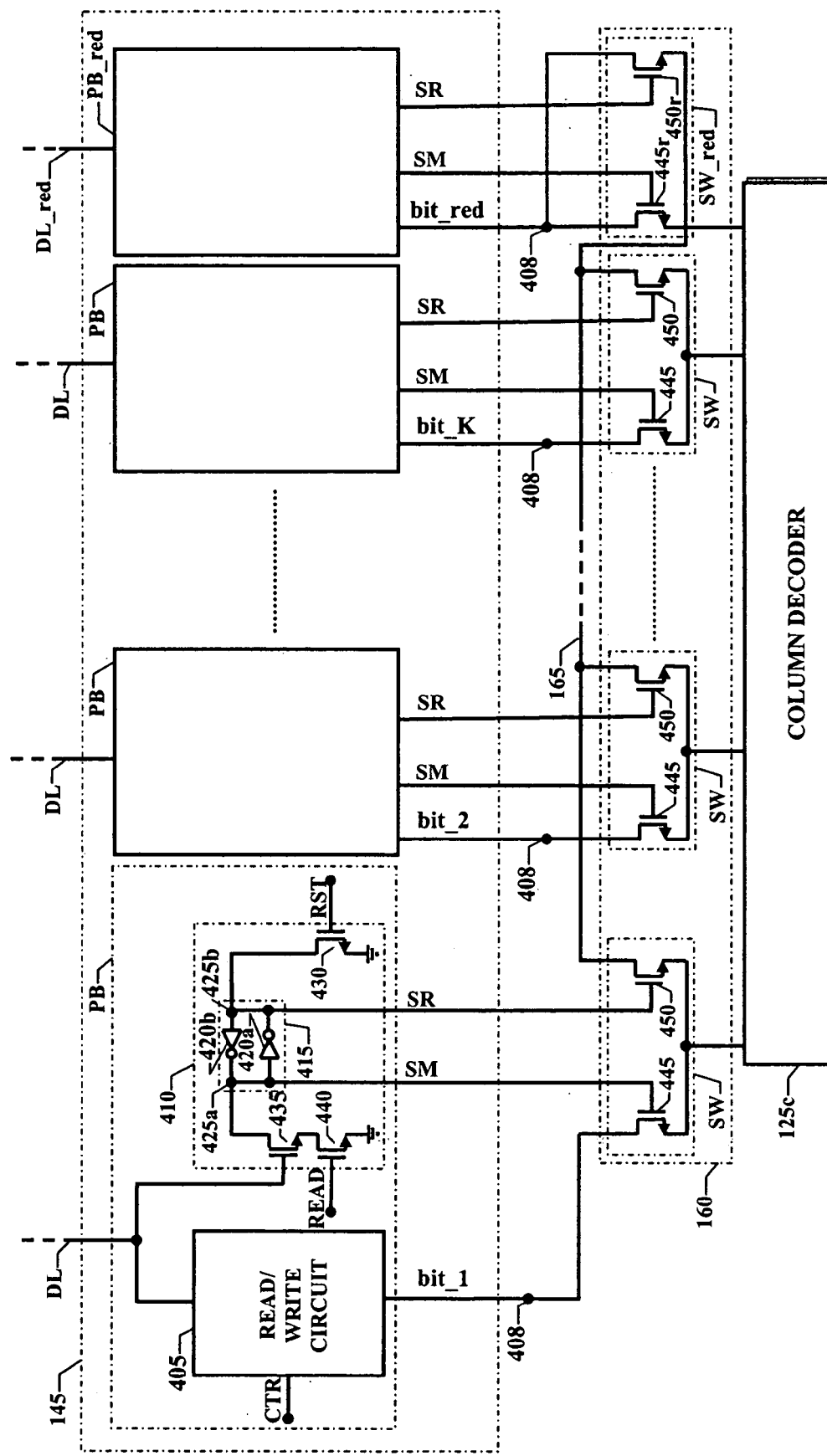
FIG. 4 represents read/write units of a page buffer connected to switching units of a multiplexer included in the NAND memory of FIG. 1.

With reference to FIG. 4, the read/write units PB and PB_red of the page buffer 145 and the switching units SW and SW_red of the R/M mux 160, according to an embodiment of the present invention, are shown in greater detail. For simplicity of illustration, considering that each pair of redundancy columns is associated with a respective set of K pairs of memory cell columns, the page buffer 145 and the M/R mux 160 are shown including only K+1 units each. In detail, each read/write unit PB of the page buffer 145 is connected to a respective data line DL in turn connectable through the bit line selector to the two bit lines BLe and BLo of a respective pair of a set. The read/write unit PB_red is connected to the redundancy data line DL_red in turn connectable through the bit line selector to the two redundancy bit lines BLe_red and BLo_red associated with the set. Each switching units SW and SW_red of the M/R mux 160 is connected to a respective read/write unit PB, PB_red.

Each read/write unit PB, PB_red includes a read/write circuit 405 adapted to read/program a selected memory cell of the matrix. Furthermore, the read/write circuits 405 are adapted to program the register array with appropriate flag bits, for example, after an EWS phase. The read/write circuit 405 is connected to the respective data line DL or DL_red and receives respective control signals CTR from the page buffer logic. The read/write circuit 405 is connected to a corresponding data terminal 408 of the page buffer 145 providing a respective data bit bit_1-bit_K, bit_red.

Each read/write unit PB and PB_red, according to one embodiment of the present invention, further includes a flag read circuit 410 in turn connected to the respective data line DL, DL_red. The flag read circuit 410 includes a latch 415 formed by two inverters 420a and 420b, connected in a loop. The input terminal of the inverter 420a is connected to the output terminal of the inverter 420b so as to define a node 425a, providing a memory selection signal SM. The output terminal of the inverter 420a is connected to the input terminal of the inverter 420b so as to define a node 425b, providing a redundancy selection signal SR that is the logic complement of the signal SM.

An N-channel MOS transistor 430 is used to reset the latch 415. For this purpose, the transistor 430 has the drain terminal connected to the node 425b, the source terminal connected to ground and the gate terminal controlled by a reset signal RST. The latch 415 is set by means of two N-channel MOS transistors 435 and 440 that are connected in series: the transistor 435 has the drain terminal connected to the node 425a and the source terminal connected to the drain terminal of the transistor 440; the source terminal of the transistor 440 is connected to ground. The gate terminal of the transistor 435 is controlled by the voltage at the data line DL, DL_red, whereas the gate terminal of the transistor 440 is controlled by a latching or read signal READ.

Each switching unit SW consists of two N-channel MOS transistors 445 and 450 acting as pass transistors. The pass transistors 445 and 450 have respective source terminals connected to the column decoder 125c. The drain terminal of the pass transistor 445 is connected to a respective data terminal 408 of the corresponding read/write circuit 405. The drain terminal of the pass transistor 450 is connected to the redundancy line 165. The gate terminal of the pass transistor 445 is connected to the node 425a of the corresponding flag read circuit 410, providing the memory selection signal SM. The gate terminal of the pass transistor 450 is connected to the node 425b of the corresponding flag read circuit 410, providing the redundancy selection signal SR.

Also the redundancy switching unit SW_red consists of two N-channel MOS transistors 445r and 450r acting as pass transistors. The pass transistor 445r has the source terminals connected to the column decoder 125c. The source terminal of the pass transistor 450r is connected to the redundancy line 165. Respective drain terminals of the pass transistors 445r and 450r are connected together to the data terminal 408 corresponding to the redundancy read/write unit PB_red, providing the redundancy data bit bit_red. The gate terminal of the pass transistor 445r is connected to the node 425a of the corresponding flag read circuit 410, providing the memory selection signal SM. The gate terminal of the pass transistor 450r is connected to the node 425b of the corresponding flag read circuit 410, providing the redundancy selection signal SR.

At the beginning of a read or a write operation on the flash memory, there is a first phase in which the flag bits F1-FK and F_red have to be read and latched into the latches 415. During this first phase the reset signal RST is asserted and the transistors 430 of the flag read circuit 410 are turned on. Then, the nodes 425b are brought to the ground voltage corresponding to the low logic '0' and, accordingly, the nodes 425a are brought to the high logic value '1'. Successively, the transistors 430 are turned off (by de-asserting the reset signal RST) and all the data lines DL and DL_red are precharged by the read/write circuit 405 to a precharge voltage sufficiently high to switch the transistors 435 on (e.g., a supply voltage of the flash memory). Then, the register array is selected to be read and the voltages reached at the data lines DL and DL_red take values according to the flag bits F1-FK and F_red.

Particularly, if the flag bit F1-FK, F_red is equal to the high logic value '1' (memory cells conductive), the data line DL, DL_red is discharged towards ground and, accordingly, the transistor 435 switches off. If the flag bit F1-FK, F_red is equal to the low logic value '0' (memory cells non-conductive), the data line DL, DL_red is kept at a high voltage and, accordingly, the transistor 435 is kept on.

In this way, when the read signal READ is asserted for reading the flag bits F1-FK, F_red and the transistor 440 can turn on, if the flag bit F1-FK, F_red is equal to the high logic value '1', the node 425a is kept at the high logic value '1', i.e., the memory selection signal SM is kept asserted (and the redundancy selection signal SR de-asserted). If the flag bit F1-FK, F_red is equal to the low logic value '0', the transistor 435 is kept on and the node 425a is brought to the low logic value '0', thus the memory selection signal SM is de-asserted and the redundancy selection signal SR asserted.

Thanks to the receiving of the memory selection signal SM asserted the transistors 445 of the switching units SW and the transistor 445r of the switching unit SW_red turn on. In this way, the data nodes 408 are connected to the column decoder 125c.

When the memory selection signal SM is provided de-asserted to one of the switching units SW (when one of the flag bits is '0'), the respective transistor 445 and the transistor 445r of the switching unit SW_red turn off. The data node 408 corresponding to the read/write unit PB receiving the flag bit equal to '0' is disconnected from the column decoder 125c. The redundancy selection signal SR is asserted and the transistor 450 of the corresponding switching unit SW turns on connecting the redundancy line 165 to the column decoder 125c. Also the transistor 450r of the switching unit SW_red turns on in response to the corresponding redundancy selection signal SR asserted (also the redundancy flag bit is equal to '0'), connecting the respective data node 408 to the redundancy line 165.

Then, a second phase follows and, considering a read operation, data bits of a selected memory page of the matrix are transferred onto the corresponding data lines DL and DL_red to be latched into the read/write circuit 405 in accordance with the control signals CTR. Accordingly, the data terminals 408 of the page buffer 145 provide the respective data bits bit_1-bit_K, bit_red.

In the case in which all the flag bits F1-FK are '1', the switching units SW provide the read data bits to the column decoder 125c. If one of the flag bits F1-FK, for example, the flag bit F3, is '0', the redundancy switching unit SW_red (also the redundancy flag bit F_red is '0') provides the read redundancy bit to the redundancy line 165. Then, the switching unit SW corresponding to the flag bit F3 selects the redundancy bit in place of the data bit read from a memory cell of a failed column.

Considering a write operation, data bits to be written into a selected memory page of the matrix are transferred from the column decoder 125c to respective switching units SW, SW_red of the M/R mux 165.

In the case in which all the flag bits F1-FK are '1', the switching units SW provide the data bits to be written to respective read/write units PB. Then, the data bits bit_1-bit_K to be written into selected memory cells are transferred onto the respective data lines DL. If one of the flag bits F1-FK, for example, the flag bit F3, is '0', the corresponding switching unit SW provides the data bit to the redundancy switching unit SW_red through the redundancy line 165 (also the redundancy flag bit F_red is '0'). Then, the redundancy switching unit SW_red provides the data bit bit_3 to the redundancy read/write unit PB_red. Then, the data bit bit_3 is transferred onto the redundancy data line DL_red to be written in a memory cell of a redundancy column in place of a memory cell of a failed column.

Before shipping a chip in which the flash memory 100 is integrated, the manufacturer performs the EWS, during which, through an appropriate test flow, the cell that present some problem are identified. Referring back to FIG. 1, after this phase the flag bits, taking values in accordance with the result of the EWS, are provided to the flash memory through the I/O interface 108. In a way similar to a write operation, the flag bits are loaded into the page buffer 145 through the column decoder 125c and the M/R mux 160, i.e., each flag bit is loaded into a respective read/write unit PB, PB_red. Then, the flag bits F1-FK are programmed into the register array 150 selected by means of the array selector 155. It has to be observed that, during this operation, the bit line selector 130 keep de-selected all the bit lines BLe, BLo, BLe_red, BLo_red of the matrix 105.

Typically, after any write operation on a selected memory page, a verify phase follows. Whenever the verify phase reveals a failure in the flash memory 100 (e.g., one or more memory cells are not correctly programmed), it may be provided that the control unit 110 of the flash memory 100 can update the flag bits stored into the register array 150. The page buffer 145 can provide the read content of the register array 150 to be updated to the control unit 110. Then, the control unit 110 can bring the flag bit corresponding to the failed column and the associated redundancy flag bit at the low logic value '0'. The updated content of the register array is then transferred from the control unit 110 to the page buffer 145 to be written into the register array 150. However, a failure of a write operation typically happens only with a very small likelihood.

Although the present invention has been described above with a certain degree of particularity with reference to a preferred embodiment thereof, it should be understood that various changes in the form and details as well as other embodiments are possible. It is pointed out that the number of bit lines and word lines as well as the size of the memory page may greatly vary, not being a limitation for the present invention. In particular, the number of memory pages that are associated with a generic word line may be higher than two, particularly multiples of two, such as four, eight and so on. The memory pages can include also a spare area exploited, e.g., for storing parity bits corresponding to the stored data word and, accordingly, the flash memory can include a further ECC circuit for verifying the correctness of a data word read from, or to be written into, a memory page. In the foregoing reference has been made to a page buffer having a storage capability equal to the data capability of a memory page, but the page buffer can have a greater size. Furthermore, the flag read circuits of the read/write units of the page buffer and the switching units of the M/R mux can be implemented in an alternative way, particularly exploiting a different number of transistors and different control signals.

Moreover, it will be apparent to those skilled in the art that the additional features providing further advantages are not essential for carrying out the invention, and may be omitted or replaced with different features. For example, the matrix can have a NOR architecture instead of a NAND architecture. Alternatively, the memory device includes a different structure for storing the flag bits in place of the register array including a row of strings of memory cells. For example, the flag could be stored directly in the matrix, the register array being not separated by means of the bit line selector. The page buffer can not include the latches for storing the read flag bit, the latches being implemented in an alternative circuit included in the memory device. Furthermore, each set of columns pair can include adjacent pairs and/or the redundancy columns can be provided in a peripheral area of the matrix.

Naturally, in order to satisfy local and specific requirements, a person skilled in the art may apply to the solution described above many modifications and alterations all of which, however, are included within the scope of protection of the invention as defined by the following claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. An electrically programmable memory device, comprising:
   a matrix of memory cells arranged in a plurality of memory arrays and at least one redundancy array, the memory arrays being grouped into at least one set; and
   means, for each memory array, for substituting the use of the memory array with the use of one of the at least one redundancy array in response to a failure of the memory array, the means for substituting including:
   means for associating each set with a predetermined one of the at least one redundancy array;
   a plurality of flags including a respective flag for each memory array indicative of the failure or not of the memory array; and
   selecting means for enabling each memory array or the associated redundancy array according to the corresponding flag, wherein the memory cells are arranged in a plurality of rows and a plurality of columns, each memory array including at least one column, wherein the matrix includes a further row memory cells for storing the flags, and wherein each memory array includes a plurality of columns, and wherein the memory device further includes a selector for selecting a column in each array, the selector being interposed between the plurality of rows and the further row.

2. The electrically programmable memory device according to claim 1, wherein the matrix has a NAND architecture with a plurality of strings of the memory cells arranged in the plurality of rows and the plurality of columns.

3. The electrically programmable memory device according to claim 2, wherein the further row of memory cells for storing the flags includes strings of memory cells.

4. The electrically programmable memory device according to claim 3 wherein the strings of the further row included in the same memory array are connected in parallel.

5. The electrically programmable memory device according to claim 1, further including a plurality of read/program units, each read/program unit corresponding to a respective one of the memory arrays or a respective one of the redundancy arrays, each read/program unit being structured for reading or programming a selected memory cell of the memory array.

6. The electrically programmable memory device according to claim 5, wherein each read/program unit further includes a storage element for latching the flag read from the corresponding memory array.

7. The electrically programmable memory device according to claim 6, wherein the selecting means includes a multiplexer for each memory array connected to an operative terminal of the read/program unit for the memory array and to an operative terminal of the read/program unit for the associated redundancy array, the multiplexer being controlled by the flag latched in the storage element of the read/program unit for the memory array.

8. The electrically programmable memory device according to claim 1, wherein the memory arrays are ordered in a sequence, the memory arrays of each set being not adjacent, and wherein the sets are organized into at least one group each one consisting of a plurality of sets, the at least one redundancy array including redundancy arrays associated with the sets of the group and positioned adjacent to the group.

9. An electrically programmable memory device, comprising:
   a matrix of memory cells arranged in a plurality of memory arrays and a plurality of redundancy arrays, the memory arrays being grouped into a plurality of sets and each set of memory arrays being associated with a corresponding one of the redundancy arrays;
   a flag array storing a plurality of flags each corresponding to one of the memory arrays and each indicating whether the corresponding memory array has failed;
   an array decoder structured to control access to the matrix of memory cells; and
   a plurality of switches coupled to the flag array and array decoder, each switch being controlled by a respective one of the flags of the flag array and having a first terminal connected to the memory array corresponding to the flag, a second terminal connected to the redundancy array associated with the memory array corresponding to the flag, and a third terminal connected to the array decoder, each switch being structured to connect the third terminal to the first or second terminals according to a value of the flag controlling the switch.

10. The memory device of claim 9, wherein the matrix has a NAND architecture with a plurality of strings of memory cells arranged in a plurality of rows and a plurality of columns, each memory array including at least one column.

11. The memory device of claim 9, wherein the flag array is part of the matrix of memory cells.

12. The memory device of claim 9, wherein each memory array includes a plurality of columns, the memory device further comprising a selector that selects a column in each memory array, the selector being interposed between the memory array and the flag array.

13. The memory device of claim 9, further comprising:
   a plurality of read/program units, each read/program unit corresponding to a respective one of the memory arrays or a respective one of the redundancy arrays, each read/program unit being structured for reading or programming a selected memory cell of the corresponding array.

14. The memory device of claim 13, wherein each read/program unit further includes a storage element for latching the flag that corresponds to the array corresponding to the read/program unit.

15. The memory device of claim 13, wherein the first terminal of each switch is connected to an operative terminal of the read/program unit for the corresponding memory array and the second terminal of each switch is connected to an operative terminal of the read/program unit for the associated redundancy array.

16. The memory device of claim 9, wherein the memory arrays are ordered in a sequence, the memory arrays of each set being not adjacent, and wherein the sets are organized into at least one group each one consisting of a plurality of sets, the redundancy arrays associated with each set of the group being positioned adjacent to the group.

17. An electrically programmable memory device, comprising:
   a matrix of memory cells arranged in a plurality of memory arrays and at least one redundancy array, the memory arrays being grouped into at least one set; and
   means, for each memory array, for substituting the use of the memory array with the use of one of the at least one redundancy array in response to a failure of the memory array, the means for substituting including:
   means for associating each set with a predetermined one of the at least one redundancy array;
   a plurality of flags including a respective flag for each memory array indicative of the failure or not of the memory array;
   selecting means for enabling each memory array or the associated redundancy array according to the corresponding flag; and
   a plurality of read/program units, each read/program unit corresponding to a respective one of the memory arrays or a respective one of the at least one redundancy array, each read/program unit being structured for reading or programming a selected memory cell of the memory array, wherein each read/program unit further includes a storage element for latching the flag read from the corresponding memory array, wherein the selecting means includes a multiplexer for each memory array connected to an operative terminal of the read/program unit for the memory array and to an operative terminal of the read/program unit for the associated redundancy array, the multiplexer being controlled by the flag latched in the storage element of the read/program unit for the memory array.

18. The electrically programmable memory device according to claim 17, wherein the matrix has a NAND architecture with a plurality of strings of memory cells arranged in a plurality of rows and a plurality of columns, each memory array including at least one column.

19. The electrically programmable memory device according to claim 18, wherein the matrix includes a further row of strings of memory cells for storing the flags.

20. The electrically programmable memory device according to claim 19, wherein each memory array includes a plurality of columns, and wherein the memory device further includes a selector for selecting a column in each array, the selector being interposed between the plurality of rows and the further row.

21. The electrically programmable memory device according to claim 20, wherein the strings of the further row included in the same memory array are connected in parallel.

22. The electrically programmable memory device according to claim 17, wherein the memory arrays are ordered in a sequence, the memory arrays of each set being not adjacent, and wherein the sets are organized into at least one group each one consisting of a plurality of sets, the at least one redundancy array including redundancy arrays associated with the sets of the group and positioned adjacent to the group.

* * * * *